United States Patent [19]
Ott et al.

[11] Patent Number: 5,302,492
[45] Date of Patent: Apr. 12, 1994

[54] METHOD OF MANUFACTURING PRINTING CIRCUIT BOARDS

[75] Inventors: Albert Ott, Bissingen an der Teck; Werner Motz, Boeblingen; Werner Kornmayer, Weil im Schoenbuch; Michael Moser, Stuttgart, all of Fed. Rep. of Germany

[73] Assignee: Hewlett-Packard Company, Palo Alto, Calif.

[21] Appl. No.: 67,396

[22] Filed: May 24, 1993

Related U.S. Application Data

[63] Continuation of Ser. No. 900,539, Jun. 19, 1992, abandoned, which is a continuation of Ser. No. 536,962, Jun. 19, 1990, abandoned.

[30] Foreign Application Priority Data

Jun. 16, 1989 [EP] European Pat. Off. ........ 89110954.8

[51] Int. Cl.$^5$ .............................. G03F 7/36; B05D 3/00
[52] U.S. Cl. ...................................... 430/314; 430/319; 156/625; 156/901; 427/96; 427/97; 427/98; 427/306
[58] Field of Search ............... 430/314, 319, 322, 323, 430/324, 325, 327, 329, 331; 204/17, 23, 32.1; 156/625, 901; 427/96, 97, 98, 306

[56] References Cited

U.S. PATENT DOCUMENTS

| | | | |
|---|---|---|---|
| 4,552,787 | 11/1985 | Chebiniak et al. | 427/306 |
| 4,568,562 | 2/1986 | Phillips | 427/40 |
| 4,702,793 | 10/1987 | Garlough | 156/638 |

FOREIGN PATENT DOCUMENTS

| | | |
|---|---|---|
| 0083488 | 7/1983 | European Pat. Off. . |
| 0090900 | 10/1983 | European Pat. Off. . |
| 0095256 | 11/1983 | European Pat. Off. . |
| 2048942 | 4/1972 | Fed. Rep. of Germany . |
| 1056814 | 2/1967 | United Kingdom . |

OTHER PUBLICATIONS

Chumbres et al. "Landless Plated-Through Hole Photoresist Masking Process" vol. 15(10), 1973, pp. 3298-3299.
Electronic Engineering, vol. 58, No. 717, Sep. 1986 pp. 21-22.
Research Disclosure No. 269, Sep. 1986, GB No. 26930.
Mesure. Regulation Automatisme, vol. 50, No. 11, Sep. 1985, pp. 81, 83-84.
Lau, et al., Overview Of Tape Automated Bonding Technology, selected pp. 274-285 and 476-479.

*Primary Examiner*—Christopher Rodee
*Assistant Examiner*—Kathleen Duda

[57] ABSTRACT

A method of manufacturing printed circuit boards is disclosed wherein metallic conductive structures are produced in a desired pattern on a carrier board of isolating material. The method begins with the provision of a carrier board having a metal foil laminated to its surface and thereafter forming conductive traces on the carrier board, deactivating the carrier board to remove substantially all substances deposited on the carrier board other than the conductive traces and forming final conductive structures by electroless chemical metal deposition on the pattern of conductive traces. Circuit boards manufactured in accordance with such a method will have final conductor structures with base layer portions of the original laminated metal foil. In a preferred embodiment, the step of deactivating the carrier board involves rinsing the carrier board with hydrochloric acid. The method can be used for manufacturing single-layer or multilayer printed circuit boards with or without through-holes and permits the formation of conductor structures in the range of 50 micrometers or less.

18 Claims, 4 Drawing Sheets

METHOD OF MANUFACTURING PRINTING CIRCUIT BOARDS

This is a continuation of application Ser. No. 900,539, filed Jan. 18, 1992, now abandoned, which is a continuation of Ser. No. 536,962, filed Jun. 12, 1990, now abandoned.

FIELD OF THE INVENTION

The invention relates to methods of manufacturing printed circuit boards wherein metallic conductor structures according to a desired pattern are produced on a carrier board of isolating, e.g. electrically insulating, material. In particular, the invention relates to methods utilizing carrier boards having a metal foil, for example a copper foil, laminated to its surface.

BACKGROUND OF THE INVENTION

Various methods for manufacturing printed circuit boards are known. An overview is given, for example, in the following publications: "Printed Circuits Handbook", C. F. Coombs, Jr. (ed.), McGraw-Hill 1988; and "Handbuch der Leiterplattentechnik", Gunther Herrmann, Eugen G. Leuze Verlag, 1982 EP-A2-O150733.

The print and etch method is used particularly for producing one-sided printed circuit boards wherein the conductive paths are applied only on one side of the board, for example, printed circuits with low packing density. The print and etch method begins with a board of non-conductive material with a copper layer laminated to one or both sides of the board. The conductive structures of the printed circuit board may be applied by using, for example, screen-printing or photographic methods (applying photoresist, exposing, developing).

For manufacturing two-sided printed circuit boards or multilayer printed circuits, one of the following methods can be used: subtractive method, fully-additive method, or semi-additive method.

The subtractive method begins with a copper-laminated isolating carrier plate, for example a glass-fibre reinforced epoxy resin plate with a copper foil on both sides of the plate having a typical thickness of 35 micrometers. Inner layers of multilayer circuits are produced by first applying a positive resist to the board. Then, the resist is exposed to light according to the pattern of conductive structures to be produced on the board and thereafter developed. Then, uncovered copper is etched away, the resist is removed and the surface conductive paths are oxidized to form a protective layer. Finally, the thus produced inner layers are pressed together to a package such as to form a multilayer circuit.

In order to produce inner layers having through-holes, the outer layers of multilayer circuits and two-sided circuits developed according to the subtractive method require certain additional process steps. First, the holes through which electrical contacts are to be established are drilled. The walls of the through-holes are metallized by chemical deposition of copper. Then the metallized walls of the through-holes are reinforced. The conductive paths are formed using the panel or pattern plating method. Finally, the outer layers are covered with a solder stop.

The subtractive method has the disadvantage that the largest part of the comparatively thick copper foil has to be etched away for the production of the conductive paths thus causing considerable loss of copper. Furthermore, since under-etching of the conductive paths cannot be avoided, the subtractive method is limited to the production of conductive structures having certain dimensions i.e., width and/or spacing of the conductive paths, of 80 to 100 micrometers.

The fully-additive method for manufacturing printed circuit boards differs from the subtractive method in that the starting board of isolating material is not covered with a copper foil, but is either a catalytic base laminate or is covered with an adhesive. After drilling the through-holes and application of a resist, the sleeves of the through-holes and the conductive paths are formed by chemical deposition of copper.

In the semi-additive method, the starting material is the same as that used with the fully-additive method. After drilling the through-holes, however, the entire surface of the board is covered with a thin layer of chemically deposited copper. Thereafter, a negative resist is applied and the walls of the through-holes and the conductive structures are electroplated. After removing the resist, the thin copper layer between the conductive structures is etched away.

As compared to the fully additive method, the semi-additive method has the advantage that the metallic sleeves in the through-holes consist substantially of electroplated copper which has an increased ductility. The disadvantages is the greater number of process steps. A disadvantage of the fully-additive and the semi-additive method in view of the subtractive method is that the adhesion of the conductor structures on the board of isolating material is worse in the additive methods. An advantage of the additive methods in view of the subtractive method is that the latter method permits in principle the production of finer conductor structures.

In United Kingdom Patent Number 1,056,814, a method for making printed circuit boards with conductive passageways through the insulating carrier board is shown. In this method, the walls of the through-holes are made conductive exclusively by electroless metal deposition. The method includes a "sensitizing" step wherein at least the walls are treated with a sensitizing solution in order to ensure good adherence of the metal to the walls, during the electroless metal deposition on the walls of the through-holes. A layer of metal is also deposited on the conductive traces on the surface of the isolating carrier board to render such traces rugged.

SUMMARY OF THE INVENTION

It is an object of the invention to provide a method for manufacturing printed circuit boards which permits production of fine conductor structures having a width of and a spacing between the conductor structures of 50 micrometers and below, and which at the same time provides good adhesion of the conductor structures on the isolating carrier board.

According to the invention, this object is solved by providing an isolating carrier board having a metal foil laminated to its surface, and producing final conductor structures by chemical metal deposition in a pattern of conductive traces corresponding to a desired pattern. Such conductive traces have as a base layer portions of the metal foil originally laminated to the carrier board. A deactivation step is performed after generation of the pattern of conductive traces and before the step of chemical metal deposition, for example, by rinsing with hydrochloric acid. In this step, any substances on the isolating carrier board outside the conductive traces are removed in order to avoid metal being deposited between the traces.

The invention is based on the discovery that very fine conductor structures can be obtained when using a carrier board to which a metal foil is pre-laminated and which foil is substantially thinner than foils used in the conventional subtractive method. According to the invention, the required final cross section of the conductor structures is produced by electroless chemical deposition of metal onto a pattern of the thin metal foil, which pattern corresponds to the desired pattern of conductor structures. During the step of chemical metal deposition, no catalyzer (activator) or resist is present on the board so that metal is only deposited on a pattern of metal traces previously produced. The step of chemical metal deposition also ensures that compensation for any flaws in the pattern of conductor traces produced in the previous steps is achieved. Such flaws may be due to pinholes in the thin metal foil laminated to the carrier board or to constrictions or scratches in the conductor traces caused during the process of their production. As a result of the chemical metal deposition, uniform flawless final conductor structures are obtained. Since the metal foil which forms the base layer of the conductor structures has been firmly laminated to the carrier board, it is ensured that the final conductor structures have good adhesion to the carrier board. The use of a thin metal foil permits precise etching of the desired pattern and thus enables the production of fine conductor structures with small dimensions. With the method of the invention, it is now easily possible to achieve conductor structures having dimensions below 50 micrometers so that printed circuit boards with very high packing density can be produced.

According to one aspect of the invention, the required conductor cross section can be produced by controlling the time during which chemical metal deposition occurs to form the final conductor structures or by appropriate selection of the composition of the chemical bath wherein the printed circuit board is immersed for chemical metal deposition. The required cross section may be determined by the required ohmic resistance of the final conductor structures, by impedance requirements or by requirements regarding heat dissipation of the current-carrying conductors.

The method of the invention can be used either for manufacturing one-sided printed circuit boards or for the inner layers of multilayer printed circuit boards without through-holes or for manufacturing the outer layers of multilayer printed circuit boards including metallization of the through-holes.

According to a preferred embodiment of the invention, a pattern of conductive traces is formed on a board having a thin metal foil layer by means of a photographic method wherein a layer of photoresist is applied on the metal foil, exposed according to the desired pattern and developed followed by an etching process. The use of thin resist layers also contributes to the attainment of fine conductor structures. In accordance with a further embodiment of the invention, the resist is a wet laminated dry film resist. Alternatively, it would also be possible to use a liquid resist.

In the production of printed circuit boards with through-holes it is advantageous to provide an intermediate step of electroplating the walls of the through-holes, since galvanically deposited metal ensures higher ductility. This is important because the through-holes may be subject to increased mechanical stress, particularly during soldering.

The metal deposited during the chemical metal deposition may be copper, nickel or nickel and gold. The use of nickel or nickel/gold has the advantage that, due to the good ductility of nickel, the thickness of the electroplated copper layer in the walls of the through-holes can be kept smaller than if less ductile copper were used to form the final layer of the printed circuit board. Furthermore, a nickel/gold finish applied on solder pads has some advantages over a copper finish when electronic components are bonded to the printed circuit board.

In one embodiment of the invention, a soldermask is applied to the printed circuit board after the step of chemical metal deposition, and this soldermask is exposed and developed to generate a pattern of a solder stop layer. In that embodiment, the only portions on the surface of the board that remain free of the solder stop layer are those where electronic components are to be soldered or bonded to, as well as through-holes. Thereafter, chemical metal deposition on the free portions is performed, i.e., on top of the layer of chemically deposited metal. The preferred metals used for this final metal deposition are nickel, or nickel and gold.

The invention has the further advantages that no special materials for the isolating carrier board are required and that known per se materials and substances in the various process steps can be used. Furthermore, no solvents comprising chlorinated hydrocarbons are required, so that the entire method is ecologically beneficial. According to another advantage, desired cross sections of the final conductors can be achieved in an easy way by correspondingly controlling the duration of the chemical metal deposition. This is particularly important when there are stringent requirements regarding the impedance of the conductor structures of the printed circuit.

BRIEF DESCRIPTION OF THE DRAWINGS

Subsequently, embodiments of the invention are described in detail with reference to the drawings.

In FIG. 1 is illustrated the method of the invention for manufacturing inner layers of a multilayer printed circuit board which has no through-holes.

DETAILED DESCRIPTION

Figure 1A:
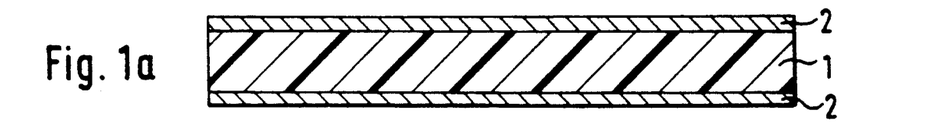
FIGS. 1a-f schematically depict cross sections through an inner layer of a multilayer printed circuit board at different process steps during the production process according to the invention, FIGS. 2a-l schematically depict cross sections through a multilayer printed circuit board at different process steps during the production of outer layers having through-holes according to the invention.

Referring to FIG. 1a, a circuit board manufactured in accordance with the present invention begins with a carrier plate 1 of an isolating material such as glass-fibre reinforced epoxy resin, polyimdie or cyanate esther. Plate 1 is coated on both sides with a thin copper foil 2 which is intimately connected to the carrier plate 1 by any known process. It is possible, for example, to start from boards of isolating material to which a thin layer of a copper foil has been laminated with good adhesion. The thickness of the copper foil 2 is selected according to the desired dimensions of the conductor structures which are to be applied to the board. According to some practical examples, the thickness of foil 2 may be 17.5, 10 or 5 micrometers.

Figure 1B:
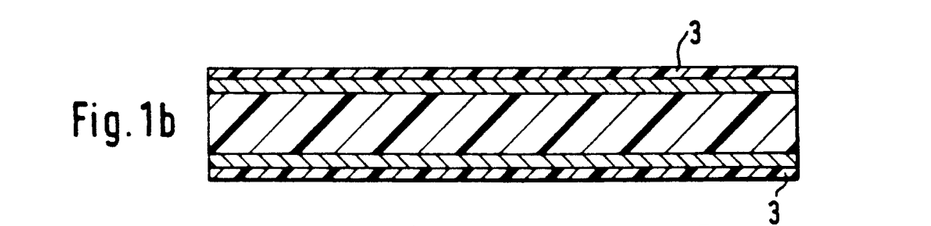

In the next step as shown in FIG. 1b, a layer of photoresist 3 is applied on both sides of the board onto the copper foil 2. Any known type of photoresist can be used. In one embodiment of the invention, an aqueous alkaline dry film photoresist layer is wet laminated onto the copper layer 2 on both sides of the board.

Figure 1C:
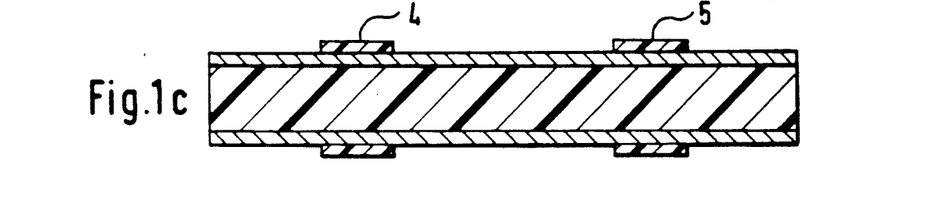
Figure 1D:
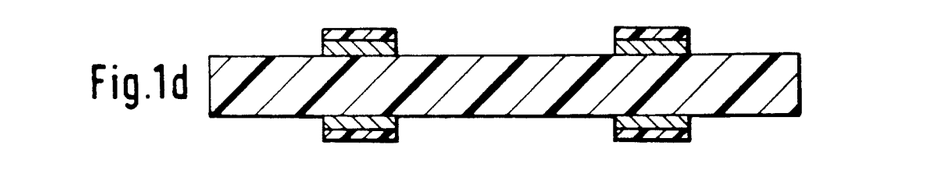

Resist 3 is exposed with a negative mask, using any known process, which mask contains a pattern of conductor structures to be applied to the board. Thereafter, a positive image is developed according to methods known per se in the manufacture of printed circuit boards. The result is shown in FIG. 1c, wherein reference numerals 4 and 5 denote parts of the pattern of photoresist which correspond to the desired pattern of conductive paths. The portion of the copper foil 2 which is not covered by resist 4, 5 is then etched away by any known process, so that the structure shown in FIG. 1d results, i.e. a pattern of copper traces covered with resist. The etching solution can be, for example, a hydrochloric solution of copper chloride.

After the etching, it is preferred that the board be deactivated by rinsing with an appropriate liquid such that the locations on the surface of board 1 which are not covered with resist 5 are completely clean and do not contain any contaminations like metallic foreign substances. The reason for this deactivation step is that any residues on the board from previous steps could act as unwanted "nuclei" for metal growth in the subsequent step of electroless metal deposition (explained in connection with FIG. 1f). A preferred deactivation (cleaning) liquid is concentrated hydrochloric acid.

It was found that by rinsing with hydrochloric acid, the copper (I) chloride which is obtained in the etching step (FIG. 1d) is resolved as chloro complex and can thus be removed from the board. The rinsing with hydrochloric acid further removes any residues due to polluted chemicals, for example, ferric chloride. Furthermore, metal abrasion (iron, nickel) and dust (calcium sulphate) are removed by this rinsing step. As a result of the deactivation step, the surface of isolating carrier board 1 which lies between the pattern of conductor structures 8, 9 with resist layer 4, 5 is completely free of foreign substances. Thus, in the step of chemical metal deposition to be described below in connection with FIG. 1f, metal will only be deposited on the conductor traces and not between them.

Figure 1E:
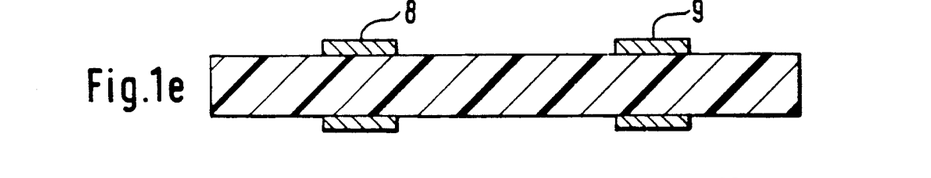

In the next step, the result of which is shown in FIG. 1e, the resist is removed by any suitable method used in the production of printed circuit boards. The isolating carrier board 1 is at this point covered with a pattern of conductive traces 8, 9 having the thickness of the copper foil 2 originally laminated to the board 1.

Figure 1F:
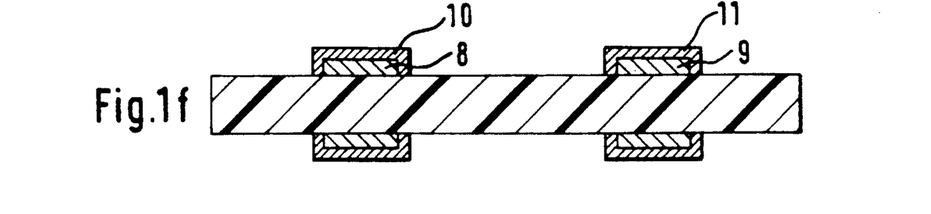

Finally, copper is chemically deposited on top of the conductive paths 8, 9 to form the desired final cross section of the conductors on the board. The result is shown in FIG. 1f depicting chemically deposited layers 10, 11 on top of the copper layers 8, 9. For this process step, known so-called additive baths for chemical copper deposition can be used. Since the board has not been provided with a catalyst or activator, and since the spaces between the conductors have been rinsed with a deactivating agent such as hydrochloric acid so that the isolation carrier board is free of foreign substances which might act as nuclei for metal deposition, copper is only deposited on those portions 8, 9 of the original copper foil 2 which have not been etched away in the earlier etching step. The remaining parts of board 1 stay free of copper. It has been found that by using the inventing method, uniform conductive paths with small dimensions can be produced. In the preceding, the production of conductors on only one side of the board has been described, but it is understood and it can be seen from FIG. 1 that by this method patterns of conductors can be produced on both sides of the board.

The step of rinsing the carrier board with a deactivating agent can be further enhanced in relation to the removal of copper by using a laminated copper foil for thin copper foil 2 which has a comparatively fine treatment, i.e., the surface of the foil which is in contact with the board is not roughened too strongly. By utilizing such a foil, the problem of removing foreign substances which might act as a nuclei for metal deposition is decreased.

It is understood that the method described in connection with FIGS. 1a–f can be used for the production of either single-layer printed circuit boards having conductor structures on one or both sides of the board or for the production of inner layers of multilayer printed circuit boards without through-holes.

In an alternate embodiment of the invention, for the production of inner layers, an additional process step between the steps illustrated in FIGS. 1a and 1b is applied. This embodiment begins with a very thin copper foil 2 laminated to both sides of carrier board 1, for example a foil having a thickness of about 5 micrometers. Thereafter, a layer of copper, having a thickness of, for example 3 to 5 micrometers is electrolessly deposited on the copper foil 2. In the next step, photoresist is applied on the copper similar to that shown in FIG. 1b. Thereafter the steps are the same as the steps explained for the above embodiment described in connection with FIGS. 1b to 1f. The alternate embodiment just described can be used if the initial copper foil 2 laminated to the isolating carrier board is very thin so that it may comprise pinholes. The step of electroless copper deposition on the entire copper foil has the purpose to produce a uniform copper layer free of any defects.

It is understood that various modifications of the two described embodiments of the process of the invention for the production of inner layers are possible. What is essential is that the final conductor structures are produced by chemical metal deposition of the previously produced pattern of conductive traces, whereby the process starts with a carrier board to which a thin metal foil has been laminated. Regarding the process steps and materials for producing the desired pattern of conductive traces, a plurality of alternatives is possible.

Figure 2A:
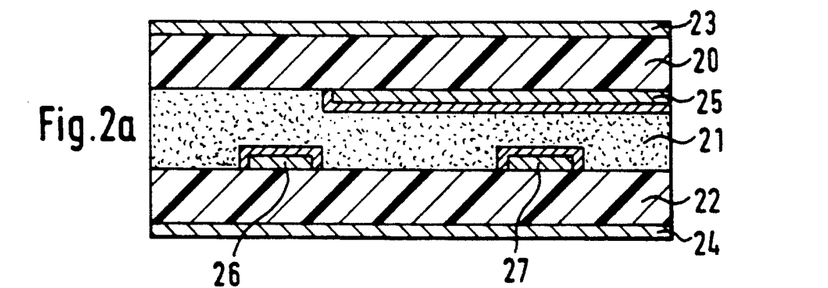

In the following, the process according to the invention for producing inner layers of multilayer printed circuit boards having through-holes and outer layers is explained with reference to FIG. 2. In FIG. 2a there is shown a multilayer package of printed circuit boards comprising a first board 20 of isolating material on which conductive structures 25 have been applied, preferably with a process as described in connection with FIG. 1. A copper foil 23 similar to the foil 2 of FIG. 1 is laminated onto the other side of the board 20. A second board 22 is equipped on one side with conductive structures 26, 27 and on the other side with a copper foil 24. Sandwiched between the boards 20 and 22 is an adhesive layer 21. The entire arrangement is pressed together to form a package.

Figure 2B:
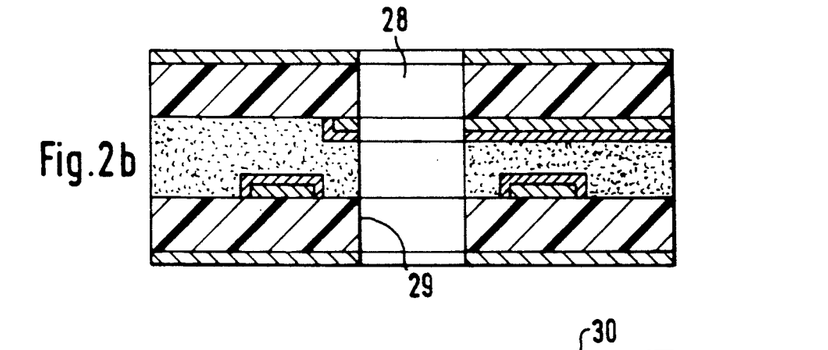
Figure 2C:
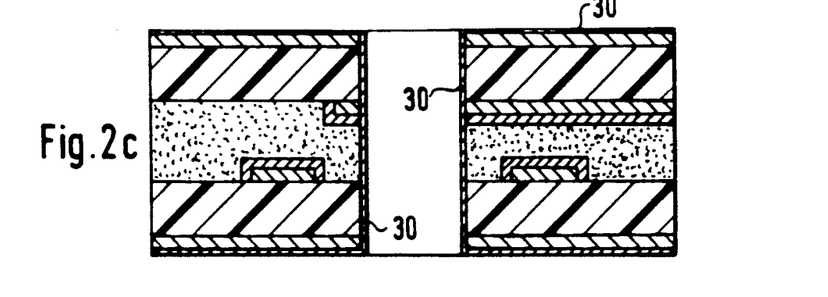

In the first step, illustrated in FIG. 2b, through-holes 28 are drilled according to a desired pattern. The walls 29 of the through-holes are then activated, for example by nucleation with palladium, to permit chemical copper deposition. In the following process step, a comparatively thin copper layer 30 (shown in FIG. 2c) is chemically deposited on the entire surface of the board including the walls 29 of the through-holes.

Figure 2D:
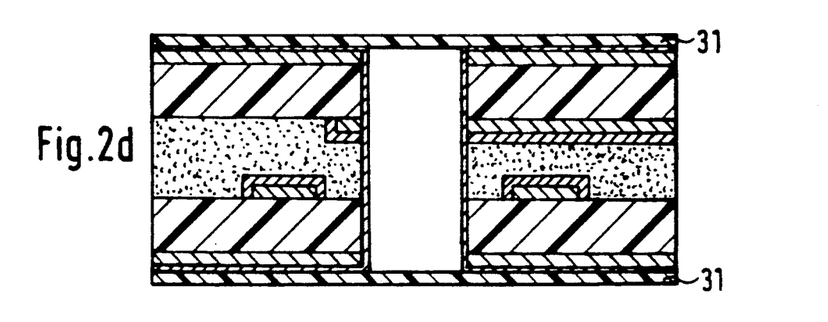
Figure 2E:
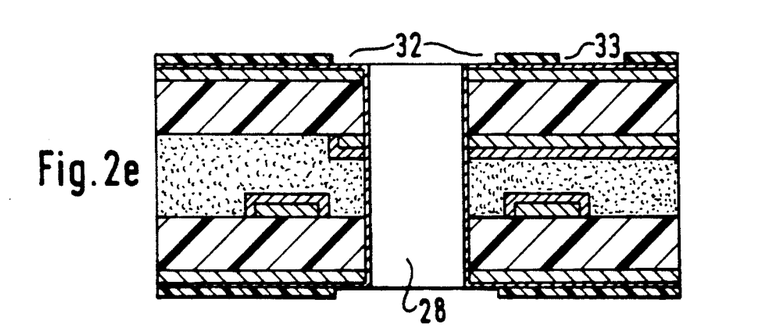

According to FIG. 2d, a photoresist layer 31 is applied on both sides of the board on top of the layer 30. The photoresist layer 31 can be the same as the photoresist layer 3 of FIG. 1b. The resist is then exposed by means of a positive mask according to the desired pattern of conductor structures and a negative image is developed, i.e., those portions 33 of the board where the final conductors are to appear and the edges 32 of the through-holes 28 are not covered with resist (FIG. 2e).

Figure 2F:
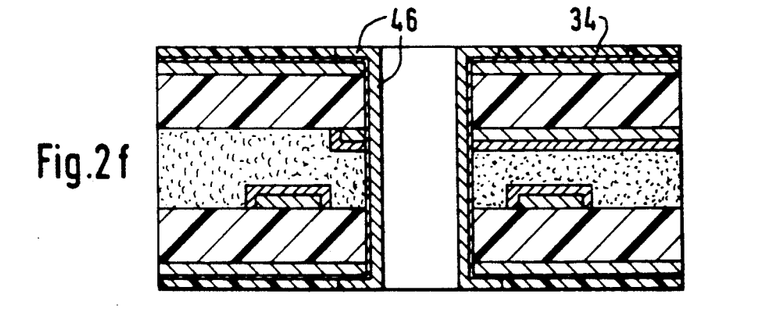
Figure 2G:
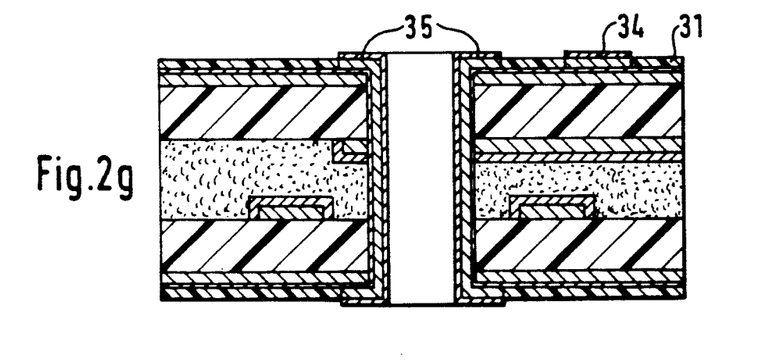
Figure 2H:
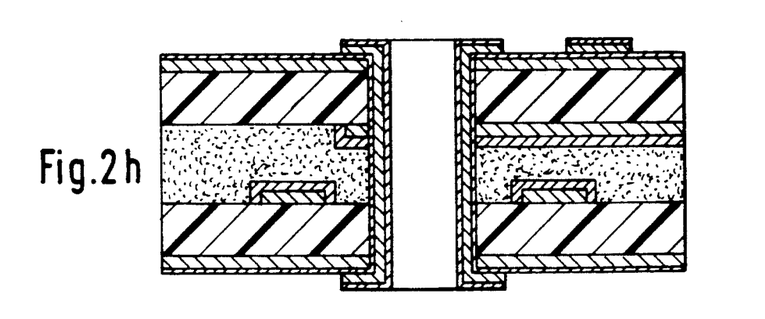

In the step according to FIG. 2f, electroplating of the walls of the through-holes and of the free spaces 32, 33 in the resist layer 31 takes place. The conductive paths 34 formed in this way and the metallized walls and edges 46 of the through-holes are then electroplated with a layer of metal resist 35, 36, for example a layer of tin (FIG. 2g). Thereafter, the photoresist 31 is removed (FIG. 2h) in a known way.

Figure 2I:
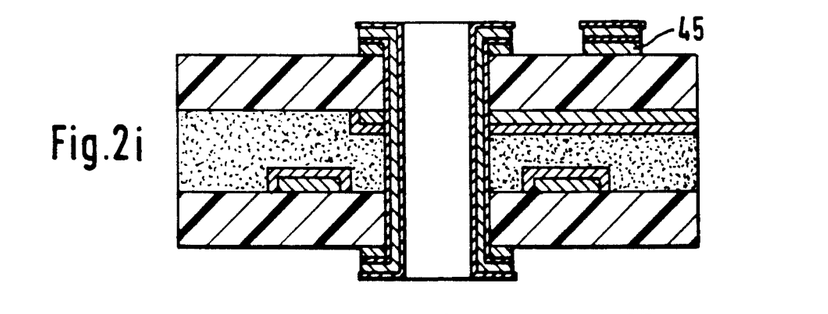
Figure 2J:
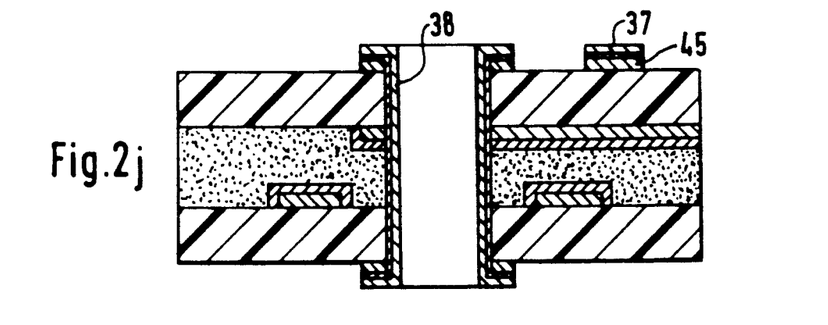

According to FIG. 2i, the uncovered copper is etched away, using, for example, an ammonia alkaline etching solution, and the metal resist 46 is then removed (FIG. 2j). As a result thereof, the board is now covered with a pattern of conducting traces, with portions 45 of the original copper foil 23 forming the base layer. Thereafter, rinsing with concentrated hydrochloric acid is performed as explained in connection with FIG. 1d in order to remove any residues from the isolating carrier board between the conductive traces.

Figure 2K:
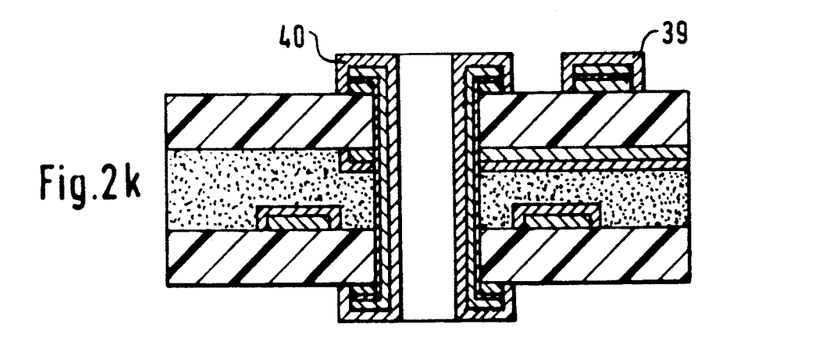
Figure 2L:
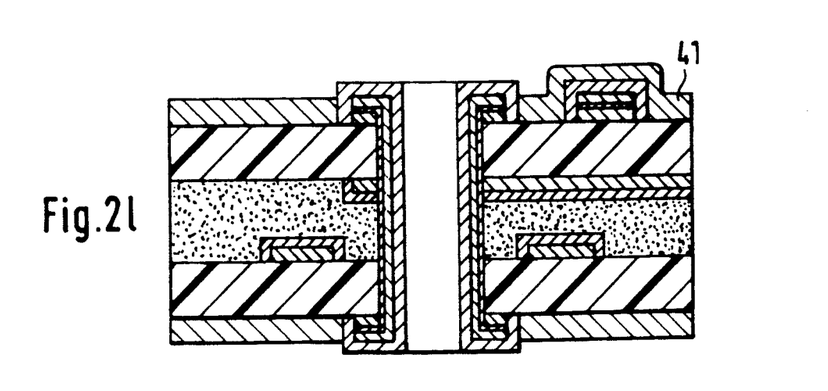

Now, in accordance with an important step of the method of the invention, the conductive paths 37 and the conductive walls 38 of the through-holes are subject to chemical copper deposition, i.e., a copper layer 39, 40 is chemically deposited on the traces 37, 38 to produce the final cross section of the conductors (FIG. 2k). Finally, a solder stop layer 41 is applied to cover those portions of the surface of the board where no metal has been deposited. It is to be understood that production of conductor structures on the lower side of the multilayer board occurs in the same way and simultaneously with the just described production of conductor structures on the upper side.

According to a practical example of the invention, conductor structures can be created having dimensions of 50 micrometers or less when using a copper foil (2, 23) having a thickness of 17.5 micrometers and a resist film (3, 31) having a thickness of 15 micrometers. When the chemical copper deposition (FIGS. 1f and 2k) is performed for about 3½ hours, the thickness of the chemically deposited layer is about 12 micrometers resulting in a total thickness of the conductor structures of about 30 micrometers. It is understood, that various chemical baths can be used for the step of chemical copper deposition so that the time required to deposit a layer of a certain thickness can vary depending on the chemical bath employed. A thickness of the conductor structures of about 30 micrometers is presently customary for printed circuit boards, but it is understood that the invention permits production of conductor structures of any desired thickness.

In an example of the invention, the layer 30 of chemically deposited copper (FIG. 2c) may have a thickness of about 2 micrometers; the copper layer 34 applied during the step of electroplating (FIG. 2f) may have a thickness of about 15 micrometers and the tin layer 35, 36 (FIG. 2g) of about 5 micrometers.

Preferred copper baths wherein the circuit board is immersed during chemical copper deposition are "additive baths" which typically comprise the following components: a cupric salt, a complexing agent, a reducing agent, a base, and a stabilizing agent. Additive baths as such are known in the art. For example, under the name "ULTRAGANTH" available from the company Schering AG, Berlin, West Germany is such an additive bath. The additive baths can still be optimized by corresponding selection of the above-mentioned components so it is ensured that the final conductor structures have good hardness, good adhesion to the copper base layer, high conductivity, and small porosity. Generally speaking, the copper baths used should ensure that the deposited copper has a structure which is similar to the crystalline structure of electroplated copper. In an embodiment of the invention, this may be achieved by selecting the concentration of the cupric salt in the additive bath to be smaller than about 0.05 mol per liter.

According to a further embodiment of the invention, the step of chemical metal deposition may comprise chemical deposition of nickel (instead of copper) whereby known per se chemical nickel baths can be used. The use of nickel has the advantage that it has a greater ductility than copper, leading to increased mechanical strength of the hole walls. Due to this increased strength, the layer of electroplated copper applied on the walls in a previous step, can be minimized. In a practical example, a 10 micrometer thick nickel layer is chemically deposited on the copper structures whereby the surface of the copper structures has been activated to ensure good adhesion of the nickel on the copper. Finally, a thin layer of gold, typically 0.1 to 0.15 micrometers thick, can be applied on the nickel layer by electroless deposition. The gold layer prevents nickel passivity and thus ensures good solderability.

A nickel/gold finish on solder pads has the further advantage of being a very suitable finish for bonding electronic components (instead of soldering) to the board. Furthermore, nickel provides a diffusion barrier for any bond metals. A nickel/gold finish is also advantageous when demountable pads are used. Since nickel has comparatively small corrodibility, the use of a nickel or nickel/gold layer as the outer layer enclosing the copper traces beneath, contributes to a high reliability of the printed circuit board.

The embodiment described above in connection with FIGS. 2a to 2l for producing outer layers of multilayer printed circuit boards or for producing inner layers with through-holes are of course not the only possible alternative within the scope of the present invention. Again, as with the above-described inner layer process, it is essential that the final connector structures and the final metal coating of the through-holes are produced by a step of electroless deposition on a pattern produced in previous process steps, starting with a thin metal foil laminated to the outer boards.

According to a still further alternative embodiment, the metal foils on the top and bottom layers of a multilayer package may have a greater thickness than those described in the previous embodiments. The reason one may start with a thicker metal foil could be, for example, that isolating carrier boards with very thin foils are more expensive to manufacture. In such a situation, the thickness of the metal foil is first reduced by etching to a thickness which permits one to achieve the desired fine conductor structures. Then, as in FIG. 2b, through-holes are drilled. As an alternative to the step of chemical copper deposition shown in FIG. 2c, several successive process steps can be employed which essentially consist of the electroless deposition of a thin metal layer on the entire surface of the board and on the walls of the through-holes followed by electroplating of the metal surfaces. Then, corresponding to FIG. 2d, a photoresist layer is applied on both sides of the board, and the resist is exposed and developed corresponding to a desired pattern of conductive traces.

For the production of conductive traces, either a positive or a negative photomask may be used, i.e., the pattern of developed photoresist may correspond either to the free spaces between the conductive traces or to the pattern of conductive traces itself. Thereafter, the spaces between the developed photoresist and the walls of the through-holes may be electroplated with a metal resist. Subsequently, the photoresist is removed, the uncovered copper is etched away and then the metal resist is removed. The final conductor paths are now produced by chemical metal deposition. Before the step of chemical metal deposition, it is preferred that rinsing with hydrochloric acid be performed to remove any unwanted material from the surface of the isolating carrier board.

Then, a soldermask is laminated to the surface of the board, exposed and developed according to a predetermined pattern. As a result, the conductive paths and the spaces between them are covered with a solder stop layer. Only the locations where electrical components are to be soldered or bonded to the board as well as the through-holes and the neighborhood of the through-holes on the surface of the board are free of the solder stop layer. In the next step, a layer of nickel is electrolessly deposited on the free spaces on the board (i.e. the spaces not covered with solder stop), and thereafter a layer of gold is electrolessly deposited on the nickel layer. The nickel layer contributes to hardness and corrosion protection and the gold layer ensures good surface conductivity. In a practical example of this embodiment, the nickel layer has a thickness of 6 to 8 micrometers, and the final gold layer has a thickness of 0.1 micrometers.

According to a still further embodiment of the invention, a negative mask has been used for the exposure of the photoresist. In such a case, the uncovered copper is etched away after development of the resist. Then the photoresist is removed before the final conductor paths are produced by chemical metal deposition.

In all embodiments, it is to be ensured that before the step of electroless metal deposition on the conductive traces, the surface of the board where no conductors are to appear has been deactivated, preferably by rinsing with hydrochloric acid.

In all embodiments, a photosensitive protective layer or soldermask may finally be applied to the top and bottom surface of the printed circuit board or the multilayer package to cover the conductive traces and the portions of the board surface where no metal has been deposited. Alternatively, a soldermask may be laminated to the board, then exposed and developed prior to the step of chemical metal deposition. The solder pattern is selected such that the conductive traces and the portions of the board where there is no metal are covered with solder stop, whereas solder pads and through-holes are not covered. Then, in the final step of electroless deposition, only the solder pads and the through-holes are covered with an additional metal layer of, for example, copper or nickel or nickel and gold.

While the invention has been described and illustrated with reference to specific embodiments, those skilled in the art will recognize that modification and variations may be made without departing from the principles of the invention as described herein above and set forth in the following claims.

We claim:

1. A method of manufacturing printed circuit boards, wherein metallic conductive structures according to a desired pattern, are produced on a carrier board of isolating material, and wherein said carrier board has a metal foil laminated to the surface of the carrier board, said method comprising the steps of:
    forming conductive traces on said carrier board from said metal foil according to a desired pattern;
    deactivating said carrier board, after having formed said conductive traces, by rinsing said carrier board to remove substantially all substances deposited on said carrier board other than said conductive traces; and
    forming final conductive structures by electroless metal deposition on said conductive traces, after deactivating said carrier board, wherein said final conductive structures have as a base layer portions of said metal foil laminated to said carrier board.

2. The method of claim 1, wherein said step of deactivating said carrier board comprises the step of rinsing said carrier board with hydrochloric acid.

3. The method of claim 1, wherein one-sided printed circuit-boards or inner layers of multilayer printed circuit boards without through-holes are to be manufactured, wherein said step of forming conductive traces comprises the steps of:
    a) applying a photoresist layer on the metal foil,
    b) exposing the photoresist layer to radiation according to a desired pattern of conductive traces,
    c) developing the photoresist layer, and
    d) etching away the portions of said metal foil which are not covered by said photoresist.

4. The method of claim 1, wherein outer layers of multilayer printed circuit boards or inner layers having through-holes are to be manufactured, further comprising the step of forming a conductive layer on the walls of said through-holes and wherein said step of forming final conductive structures further comprises covering the walls of the through-holes with a layer of chemically deposited metal, after said step of forming said conductive layer in said through-holes.

5. The method of claim 4, wherein said step of forming a conductive layer in said through-holes comprises the steps of electroplating said through holes and said step of covering the walls of said through-holes comprises depositing a layer of electroless chemical metal deposition on said conductive traces and on said conductive layer formed on the walls of the through-holes.

6. The method of claim 4, wherein the step of forming a pattern of conductive traces comprises the steps of applying a photoresist layer, exposing the photoresist layer to radiation according to said pattern of conductive traces, and developing the photoresist layer.

7. The method of claim 6, wherein the step of applying a photoresist layer comprises the step of applying a layer of dry film resist.

8. The method of claim 7 wherein the step of applying a layer of dry film resist comprises the step of applying dry film resist to a thickness less than approximately 15 micrometers.

9. The method of claim 1, wherein the thickness of the metal foil is less than approximately 17 micrometers.

10. The method of claim 1, wherein the metal deposited on the conductive traces by electroless chemical metal deposition is copper.

11. The method of claim 10, wherein said step of forming final conductive structures further comprises immersing the carrier board in an additive bath, said bath comprising a cupric salt in a concentration of less than about 0.05 moles per liter.

12. The method of claim 1, wherein the metal deposited on the conductive traces by electroless chemical metal deposition is nickel or a layer of nickel followed by a layer of gold.

13. The method of claim 1, wherein said metal foil is a copper foil.

14. The method of claim 1, further comprising the steps of applying a photosensitive protective layer to the surface of the board after forming final conductive structures by chemical metal depositions;

exposing and developing said photosensitive protective layer according to a predetermined pattern; and depositing metal by electroless metal deposition on those portions of the carrier board surface which are not covered with the exposed and developed protective layer.

15. The method of claim 14, wherein said photosensitive protective layer is a solder mask.

16. The method of claim 14, wherein the metal which is electrolessly deposited comprises nickel and further comprising the step of depositing a layer of gold on the nickel layer by electroless metal deposition.

17. A method of manufacturing printed circuit boards, wherein metallic conductive structures according to a desired pattern, are produced on a carrier board of isolating material, and wherein said carrier board has a metal foil laminated to the surface of the carrier board, said method comprising the steps of:

forming conductive traces on said carrier board from said metal foil according to a desired pattern;

deactivating said carrier board, after having formed said conductive traces, by exposing said carrier board to hydrochloric acid to remove substantially all substances deposited on said carrier board other than said conductive traces; and forming final conductive structures by electroless metal deposition on said conductive traces, after deactivating said carrier board, wherein said final conductive structures have as a base layer portions of said metal foil laminated to said carrier board.

18. A method of manufacturing printed circuit boards, wherein metallic conductive structures according to a desired pattern, are produced on a carrier board of isolating material, and wherein said carrier board has a metal foil laminated to the surface of the carrier board, said method comprising the steps of:

forming conductive traces on said carrier board from said metal foil according to a desired pattern;

deactivating said carrier board, after having formed said conductive traces, by treating said carrier board with a complexing agent for a time and under reaction conditions sufficient to remove remaining traces of said metal foil, other than said conductive traces, as a complex; and forming final conductive structures by electroless metal deposition on said conductive traces, after deactivating said carrier board, wherein said final conductive structures have as a base layer portions of said metal foil laminated to said carrier board.

* * * * *